United States Patent [19]
Stevens

[11] Patent Number: 5,537,311
[45] Date of Patent: Jul. 16, 1996

[54] APPARATUS FOR ALIGNING SUBSTRATES FOR LOADING AND UNLOADING USING A ROBOT MECHANISM

[75] Inventor: Craig L. Stevens, Felton, Calif.

[73] Assignee: Applied Materials, Inc., Santa Clara, Calif.

[21] Appl. No.: 380,221

[22] Filed: Jan. 23, 1995

Related U.S. Application Data

[63] Continuation of Ser. No. 10,131, Jan. 28, 1993, abandoned.

[51] Int. Cl.⁶ .................................................. G06F 19/00
[52] U.S. Cl. ........................ 364/167.01; 364/478.16; 364/559; 395/89
[58] Field of Search .......................... 364/167.01, 478, 364/559, 488–491; 395/89, 93, 94; 901/9, 46, 47; 348/87, 94, 95

[56] References Cited

U.S. PATENT DOCUMENTS

| | | | |
|---|---|---|---|
| 4,475,122 | 10/1984 | Green | 358/101 |
| 4,562,551 | 12/1985 | Inaba et al. | 364/513 |
| 4,781,511 | 11/1988 | Harada et al. | 414/222 |
| 4,806,057 | 2/1989 | Cay et al. | 414/225 |
| 4,808,059 | 2/1989 | Eddy | 414/416 |
| 4,836,733 | 6/1989 | Hertel et al. | 414/225 |
| 4,846,626 | 6/1989 | Englebrecht | 414/754 |
| 4,870,288 | 9/1989 | Abuku et al. | 250/548 |
| 4,881,863 | 11/1989 | Braginsky | 414/225 |
| 4,907,931 | 3/1990 | Mallory et al. | 414/225 |
| 4,911,597 | 3/1990 | Maydan et al. | 414/217 |
| 4,917,556 | 4/1990 | Stark et al. | 414/217 |
| 4,951,601 | 8/1990 | Maydan et al. | 118/719 |
| 5,177,563 | 1/1993 | Everett et al. | 356/375 |

OTHER PUBLICATIONS

Joint Development Agreement Between Applied Materials, Inc. (Applicant's Assignee) and two unrelated companies (Companies A & B), dated May 29, 1991 (Exhibit A hereto).

*Primary Examiner*—Joseph Ruggiero
*Attorney, Agent, or Firm*—Lawrence Edelman; Noel F. Heal

[57] ABSTRACT

A technique for automatically compensating for differences in orientation of a workpiece, such as a rectangular substrate, a substrate cassette, a loadlock for accessing a vacuum chamber, and a substrate support on a robot mechanism. Sensors on the substrate support detect the position of a front edge of a substrate, a cassette or a loadlock, and measurements taken at the time the sensors are tripped by the edge are used to compute linear, angular and radial position corrections. More specifically, in moving a substrate from a cassette to the loadlock, the substrate support compensates for the orientation of the cassette, compensates for the orientation of the substrate within the cassette, and withdraws the substrate without contact with the cassette walls, and without the need for moving edge guides to orient the substrate. Before placing the substrate in the loadlock, the mechanism translates the substrate past a fixed sensor to determine the substrate position on the substrate support, and makes appropriate corrections to predicted linear and radial positions of the loadlock. The procedure for removing a substrate from the loadlock and placing it in a cassette employs a similar set of steps.

22 Claims, 10 Drawing Sheets

APPARATUS FOR ALIGNING SUBSTRATES FOR LOADING AND UNLOADING USING A ROBOT MECHANISM

This application is a continuation of application Ser. No. 08/010,131, filed Jan. 28, 1993, abandoned.

BACKGROUND OF THE INVENTION

This invention relates generally to techniques for handling substrates processed in an automated fabrication system and, more particularly, to the alignment and positioning of rectangular substrates with respect to substrate cassettes and substrate loadlocks. Although there are many existing and proposed systems for moving circular semiconductor wafers in and out of processing chambers, the techniques employed for aligning and positioning circular wafers are, for the most part, inappropriate for the processing of rectangular substrates of glass or similar materials.

In a processing system with which the present invention is principally concerned, large rectangular glass substrates are presented to the system stacked in cassettes. Each cassette may hold a number of substrates in a vertical stack, with each substrate held from beneath by edge supports. In a cassette loading operation, a robot mechanism moves the substrates one by one from the cassettes to a loadlock, which has multiple vertical positions for the substrates. In the processing system, the substrates are removed from the loadlock through another door, and are subjected to a variety of processing steps, none of which is of concern to the present invention. Upon completion of processing, substrates are placed back in the loadlock, or perhaps in a different loadlock, and the robot mechanism moves the substrates from the loadlock back into cassettes.

The robot mechanism may be of any type that provides for movement of a workpiece support, referred to as an end effector, in three dimensions. In robot technology, it is common to "teach" a robot mechanism the position of an object or objects that are to be picked up and moved. The teaching mode of operation generally requires that the mechanism be moved under manual control to the desired position. In its automatic mode of operation, the mechanism moves repeatedly to the learned position where a workpiece is to be picked up and moved. The destination position of the workpiece is also taught to the robot mechanism. Two practical difficulties in the present system limit the accuracy of the substrate positions taught to the robot mechanism.

First, substrates are placed in a cassette within a deliberate angular and positional tolerance. In other words, the cassettes are made to provide a relatively loose fit for the substrates, both angularly and positionally. To make a cassette for a tighter fit with the substrates would inevitably result in scraping of the substrates on the cassette walls while placing the substrates in and removing them from the cassettes. Scraping or rubbing of the glass substrates is undesirable because it increases the probability of particulate contamination during processing. A second aspect of the positional uncertainty of the substrates results from a degree of uncertainty in the orientation and position of the cassettes themselves. The cassettes are placed manually on a work table, and positioned within locating ridges or other features of the table. Some degree of positional uncertainty is deliberately provided, to facilitate handling of the cassettes. The result of these positional uncertainties (of the cassettes with respect to the work table, and of the substrates with respect to the cassettes), is that a substrate position taught to the robot mechanism is only an approximation of the actual substrate position, and means must be provided to compensate for variations in the substrate position. In the past, alignment of rectangular substrates has been effected by means of movable edge guides that bodily move the substrates into conformance with a predicted position. The drawback of this approach is that it requires sliding contact with the substrate edges, which increases the likelihood of particulate contamination.

It will be appreciated from the foregoing that there is need for a better technique for aligning rectangular substrates with a robot arm that picks them up for movement to a loadlock or other processing chamber. Ideally, the technique should not require pushing, or otherwise repositioning the substrates, either in a cassette or when loaded onto the robot arm. The present invention addresses this need.

SUMMARY OF THE INVENTION

The present invention resides in a method, and corresponding apparatus, for aligning a robot arm end effector with a workpiece having a straight edge, such as a substrate, or with a workpiece container, such as a substrate cassette or a load lock. Briefly, and in general terms, the method of the invention comprises the steps of positioning a robot arm adjacent to a predicted workpiece location; moving the robot arm toward the workpiece in a direction predicted to be perpendicular to a front edge of the workpiece; sensing the location of the front edge with at least two sensors installed on the robot arm; calculating an angular correction needed to be applied to the robot arm such that it will approach the front edge of the workpiece perpendicularly; and calculating from the angular correction a corresponding linear correction needed to be applied to the robot arm to ensure that it will approach the workpiece at a desired relative location.

The method further includes the steps of applying the angular and linear corrections to the robot arm; and moving the robot arm toward the workpiece in the corrected angular direction, to position a workpiece support of the robot arm directly beneath the workpiece. The method further includes the steps of computing a corrected distance through which to move the robot arm; and moving the robot arm through the corrected distance, such that the workpiece support is centered under the workpiece.

The invention may also be defined as a method for picking up a workpiece having a generally rectangular shape from a workpiece container, wherein the precise orientation of the container, and of the workpiece within the container, are unknown. The method comprises the steps of positioning a workpiece support of a robot arm in a location adjacent to a predicted workpiece container location; detecting a front edge of the container with at least two sensors mounted on the workpiece support; applying angular and linear corrections to the workpiece support to align it with the detected position of the container; moving the workpiece support into the container and beneath a workpiece to be picked up; detecting a front edge of the workpiece within the container; applying angular and linear corrections to the workpiece support to align it with the detected position of the workpiece; picking up the workpiece; applying angular and linear corrections to the workpiece support to move the workpiece into alignment with the container; and withdrawing the workpiece from the container.

More specifically, the workpiece support is mounted at the end of the robot arm, for radial and angular movement about an axis. Each step of detecting a front edge includes recording a first radial distance from the axis to a reference point on the workpiece support, when a first sensor on the workpiece support detects the straight edge, and recording a second radial distance from the axis to the reference point when a second sensor on the workpiece support detects the straight edge. Each step of applying angular and linear corrections is preceded by a step of computing the angular and linear corrections from the first and second radial distances and the spacing between the first and second sensors.

Even more specifically, the step of computing the angular and linear corrections includes computing the angular correction from the inverse tangent of the ratio of the difference between the first and second radial distances and the spacing between the first and second sensors; and computing the linear correction from the product of one of the radial distances and the tangent of the angular correction.

In accordance with another aspect of the invention, the method further includes the steps of sensing the lateral position of the substrate on the substrate support; and compensating for any deviation from a predicted lateral position of the substrate on the substrate support. The step of sensing the lateral position of the substrate includes translating the substrate linearly and detecting the position of a side edge of the substrate as it passes a substrate detector. This technique requires the preliminary steps of translating the substrate support linearly and detecting the position of a side edge of the substrate support, and then deriving a predicted lateral position of the substrate edge, based on an assumption of symmetrical positioning of the substrate on the substrate support. Then, the step of compensating for any deviation from the predicted lateral position of the substrate includes computing a linear correction from the difference between the predicted and detected positions of the substrate edge, and computing a radial correction from the linear correction and a known orientation of a container in which the substrate is to be placed.

Another way to define the invention is in terms of a method for moving generally rectangular workpiece from a first container to a second container, using a substrate support capable of angular and radial motion about an axis, which is movable linearly. The precise orientation of the containers, and of the workpiece within the first container, are unknown. The method comprises the steps of determining the orientation of the first container, by moving a workpiece support to a predicted linear position adjacent to the container, orienting the workpiece support at a predicted angular position, and advancing the workpiece support radially to detect an edge of the container; correcting the predicted linear and angular positions of the first container; performing the foregoing steps for the second container; moving the workpiece support to the corrected position of the first container and advancing the support radially toward a workpiece in the container; detecting any orientation error of the workpiece in the first container and adjusting the linear and angular positions of the workpiece support to compensate for the orientation error; picking up the workpiece with the workpiece support; re-adjusting, if necessary, the angular and linear positions of the workpiece support to conform with the orientation of the first container; and withdrawing the workpiece and workpiece support from the first container without contact with the container. Then the method involves the steps of moving the workpiece support to the corrected linear and angular position of the second container; advancing the workpiece support radially into the second container; and placing the workpiece in the second container.

This method further comprises the step of translating the workpiece support laterally past a workpiece edge sensor, after withdrawing the workpiece from the first container, to determine the lateral position of the workpiece with respect to the workpiece support. Then follows a step of compensating for any difference between the sensed position of the workpiece edge and a predicted position of the workpiece edge, to ensure that the workpiece is placed centrally in the second container. More specifically, the workpiece in this method is a rectangular glass substrate and the first and second containers are either a substrate cassette or a loadlock.

In terms of apparatus, the invention may be defined as including means for positioning a robot arm linearly adjacent to a predicted workpiece location; means for moving the robot arm toward the workpiece in a direction predicted to be perpendicular to a straight front edge of the workpiece; at least two sensors installed on the robot arm, for sensing the location of the front edge of the workpiece; means for calculating an angular correction needed to be applied to the robot arm such that it will approach the front edge of the workpiece perpendicularly; and means for calculating from the angular correction a corresponding linear correction needed to be applied to the robot arm to ensure that it will approach the workpiece at a desired relative location.

The apparatus also includes means for applying the angular and linear corrections to the robot arm; and means for moving the robot arm toward the workpiece in the corrected angular direction, to position a workpiece support of the robot arm directly beneath the workpiece. The apparatus further includes means for computing a corrected distance through which to move the robot arm; and means for moving the robot arm through the corrected distance, such that the workpiece support is centered under the workpiece.

Other definitions of the invention in apparatus terms are possible, consistent with the foregoing specification.

It will be appreciated from the foregoing that the present invention represents a significant advance in the field of robot mechanisms for handling generally rectangular substrates. In particular, the invention provides for automatic alignment with the substrates, substrate cassettes and loadlocks, so that bodily sliding and scraping contact with the substrates is avoided. Other aspects and advantages of the invention will become apparent from the following more detailed description, taken in conjunction with the accompanying drawings.

DESCRIPTION OF THE PREFERRED EMBODIMENT

Figure 1:
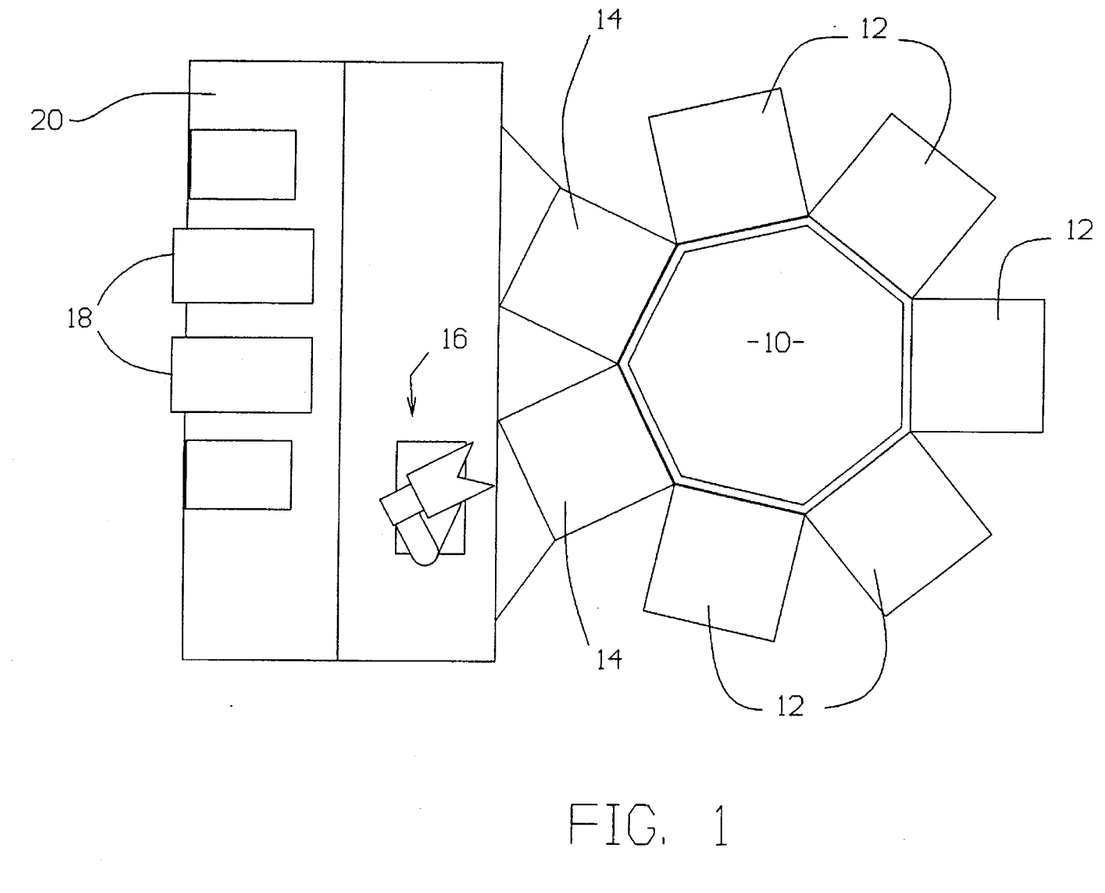
FIG. 1 is a simplified plan view of a substrate processing system with which the present invention is concerned.

As shown in the drawings for purposes of illustration, the present invention is concerned with difficulties of alignment of a robot arm with substrates that are to be moved from substrate cassettes to loadlocks, and from loadlocks back to the cassettes. FIG. 1 shows by way of background the environment in which the invention may be used, namely a semiconductor processing system in which large substrates are moved from one processing chamber to another through a centrally located vacuum transfer chamber, indicated by reference numeral 10. The processing chambers are indicated by numeral 12, and five are shown by way of example. Details of the processes performed in the chambers 12 are not important to the present invention. They may, for example, involve various chemical vapor deposition steps performed on large rectangular glass substrates.

The processing system also includes two loadlocks 14 through which the substrates are loaded into and unloaded from the system. Basically, each load lock has two doors (not shown), one into the transfer chamber 10 and the other to atmosphere. To load substrates, they are placed in one of the loadlocks from the atmospheric side; then the loadlock is evacuated and is emptied from the transfer chamber side. Loading and unloading the loadlocks 14 is the task of a robot mechanism 16, which is capable of movement in three dimensions. Substrates to be processed are stacked vertically on separate shelves in cassettes, indicated at 18, and the cassettes are placed on a work table 20. In the loading operation, the robot 16 takes the substrates one at a time from the cassettes 18 and places them in one of the loadlocks 14. Unloading requires the robot 16 to take substrates from one of the loadlocks 14 and place them in the cassettes 18.

The loading operation has to be performed to a high degree of precision, to avoid unwanted contact between a substrate and the sidewalls of its cassette 18, or between a substrate and the sidewalls of the loadlocks 14. Although the robot 16 can be "taught" the position of each cassette 18 on the work table 20, repeatable precision is rendered difficult by deliberate inaccuracies permitted in the alignment of the substrates in their cassettes, and in the alignment of the cassettes on the work table 20.

Figure 2:
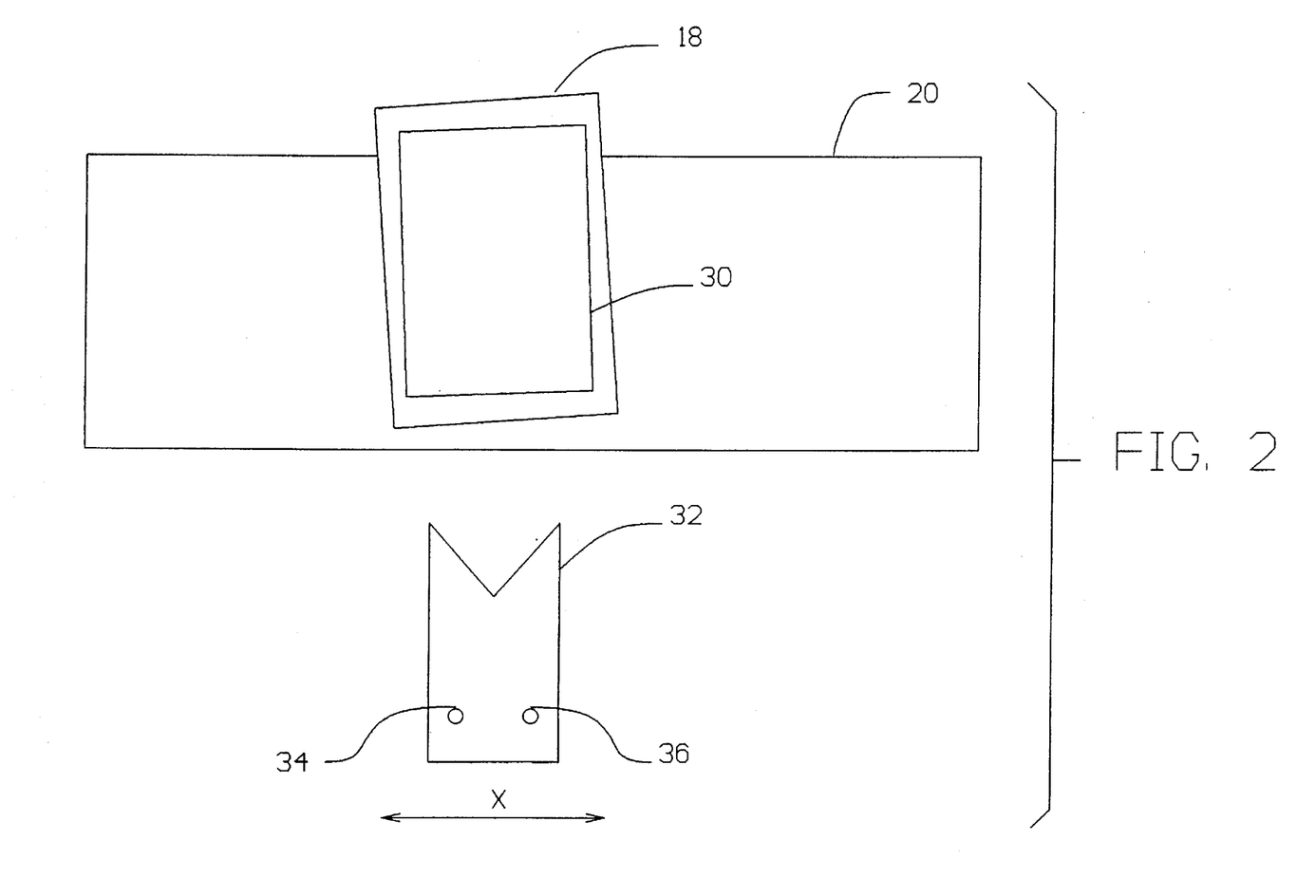
FIG. 2 is simplified plan view of substrate, shown in relation to a substrate cassette, a work table, and a robot mechanism end effector.
Figure 17:
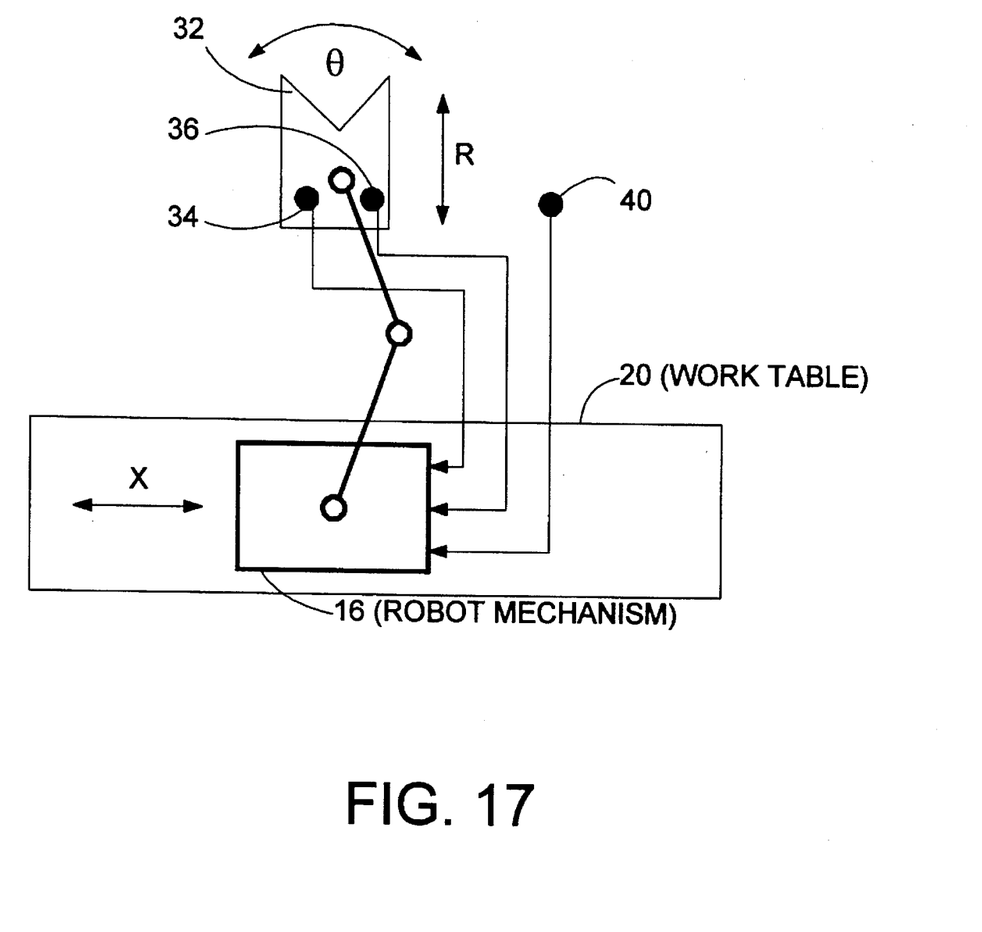
FIG. 17 is a further hardware diagram showing the robot mechanism of FIG. 1 in relation to its associated end effector, work table, sensors, and axes of motion.

The basic alignment problem is shown in exaggerated form in FIGS. 2 and 17, which depicts the alignment of substrate 30 with respect to a substrate cassette 18 placed on the work table 20. The robot mechanism has an end effector 32, which would normally be "taught" to approach the cassette and substrate at a predicted location in the x axis (parallel to the work table 20, and in a predicted direction, usually perpendicular to the edge of the work table. However, the cassette 18 is not angularly aligned with work table 20, and the substrate 30 to be picked up is not angularly aligned with cassette.

In accordance with the invention, the robot mechanism automatically learns the misaligned position of the cassette 18 and the misaligned position of the substrate 30 before picking up the substrate in alignment with the end effector. In a related operation, the robot mechanism also learns the correct position of a loadlock 14 in which the substrate is to be placed.

Although various types of robot mechanisms may be used within the scope of this invention, the principles of the invention will be described in relation to a robot mechanism capable of movement radially and angularly with respect to a principal axis, and linearly along an axis x, which is generally parallel to the work table 20 in FIG. 2. The radial and angular motions are referred to as R and θ, respectively. The robot mechanism is also capable of movement in a vertical (z) direction, to pick up substrates from various levels in the cassette 18 and to place them in various levels of the loadlock 14.

Figure 12:
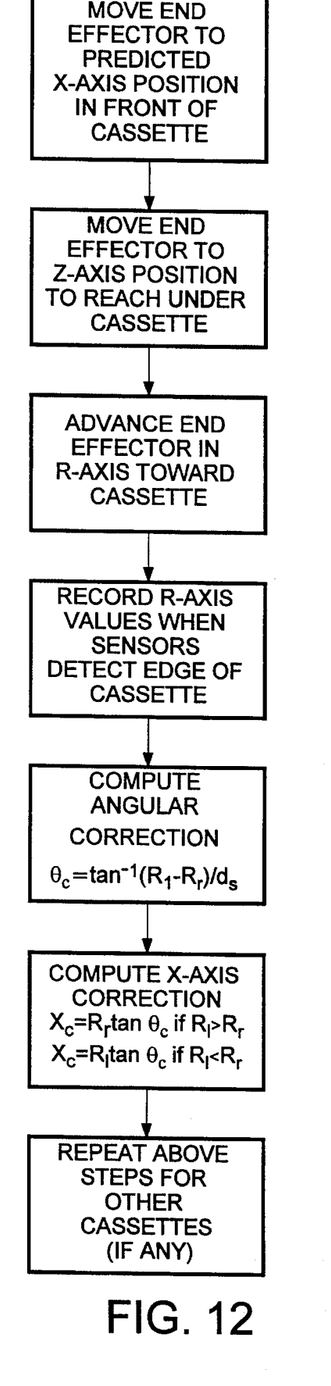
FIG. 12 is a flowchart depicting the operations performed by the invention in correcting for cassette position and orientation.

Cassette position/orientation (FIG. 12):

To pick up a substrate 30 from a cassette 18, the robot mechanism 16 must first determine the precise position and orientation of the cassette. The first step is to move the robot end effector 32 to a predetermined or predicted x-axis position in front of the cassette 18, and then lower the end effector so that it can reach under the cassette, and advance the end effector radially in the predicted direction of the cassette, i.e. perpendicular to the edge of the work table 20. The end effector 32 has two infrared sensors 34 and 36 mounted symmetrically at a position toward the rear of the end effector. As the end effector 32 reaches the front edge of the cassette, the infrared sensors 34 and 36 are triggered one at a time (assuming there is an angular error in the cassette position). Advancement of the end effector 32 along the R axis is stopped when the second of the sensors 34 and 36 detects the edge of the cassette 18.

Figure 3:
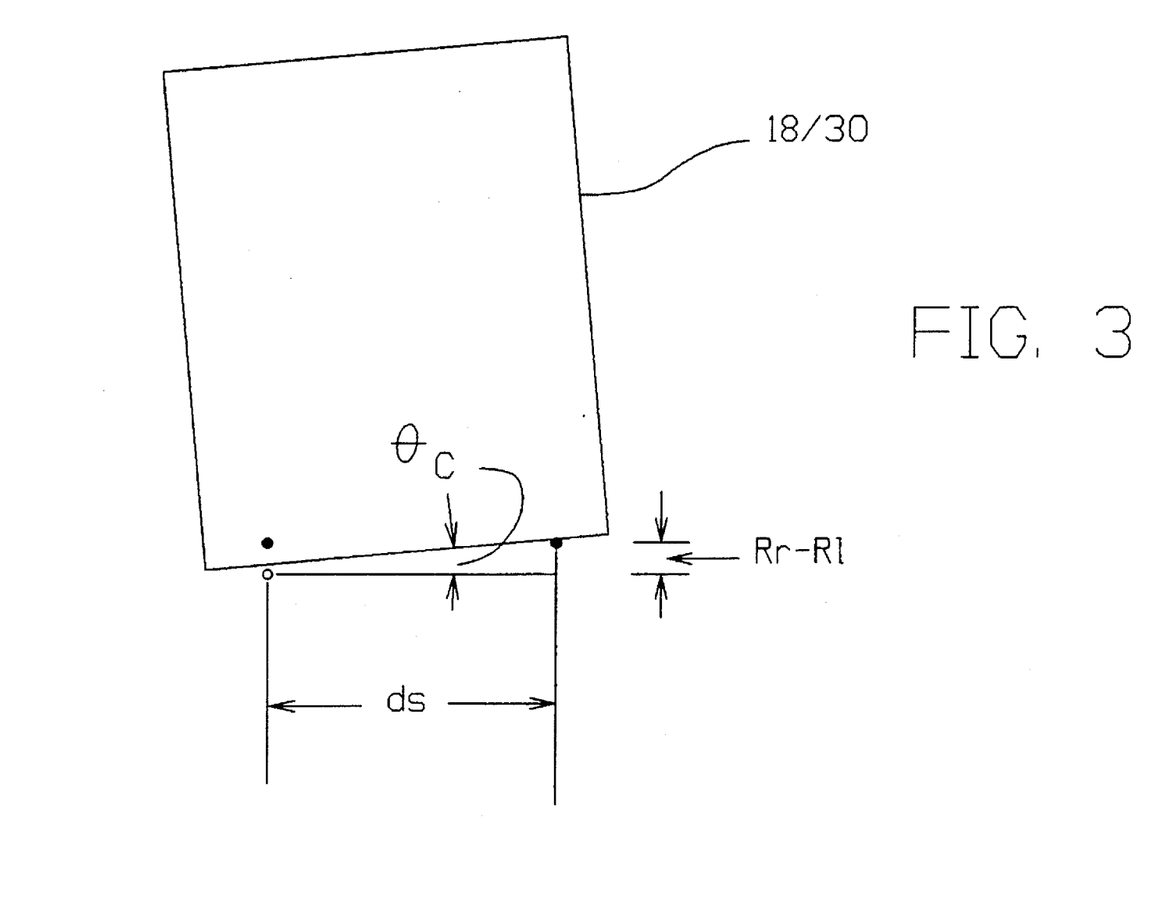
FIG. 3 is a plan view diagram showing the principle of the invention as used to measure an angular orientation error.

This is the position shown in FIG. 3, from which it will apparent that the angular correction $\theta_c$ needed to be applied to the end effector 32 is given by the expression:

$$\theta_c = \tan^{-1}(R_l - R_r)/d_s \quad (1)$$

where $R_l$ and $R_r$ are the radius dimensions recorded when the left and right detectors 34 and 36 sense the edge of the cassette, and $d_s$ is the spacing between the detectors. A positive angle correction $\theta_c$ means that the robot arm has to be rotated clockwise to effect the correction.

The x-axis correction is determined from the expressions: $X_c = R_r \tan \theta_c$ if $R_l > R_r$, or $$X_c = R_l \tan \theta_c \text{ if } R_l < R_r \quad (2)$$

This procedure is normally repeated for any other cassettes on the work table 20, and the new X-axis positions and g-axis values are saved for each cassette.

Figure 4:
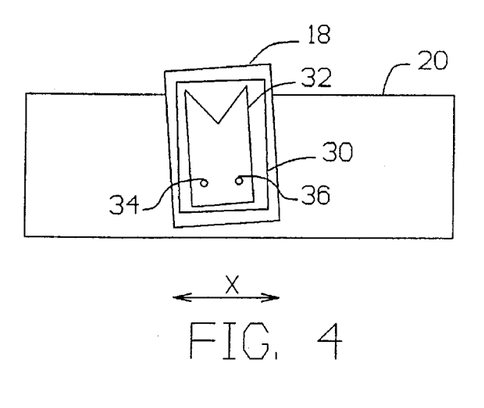
FIGS. 4–7 are a sequence of plan view diagrams showing the basic steps involved in picking up a substrate from a cassette.
Figure 13:
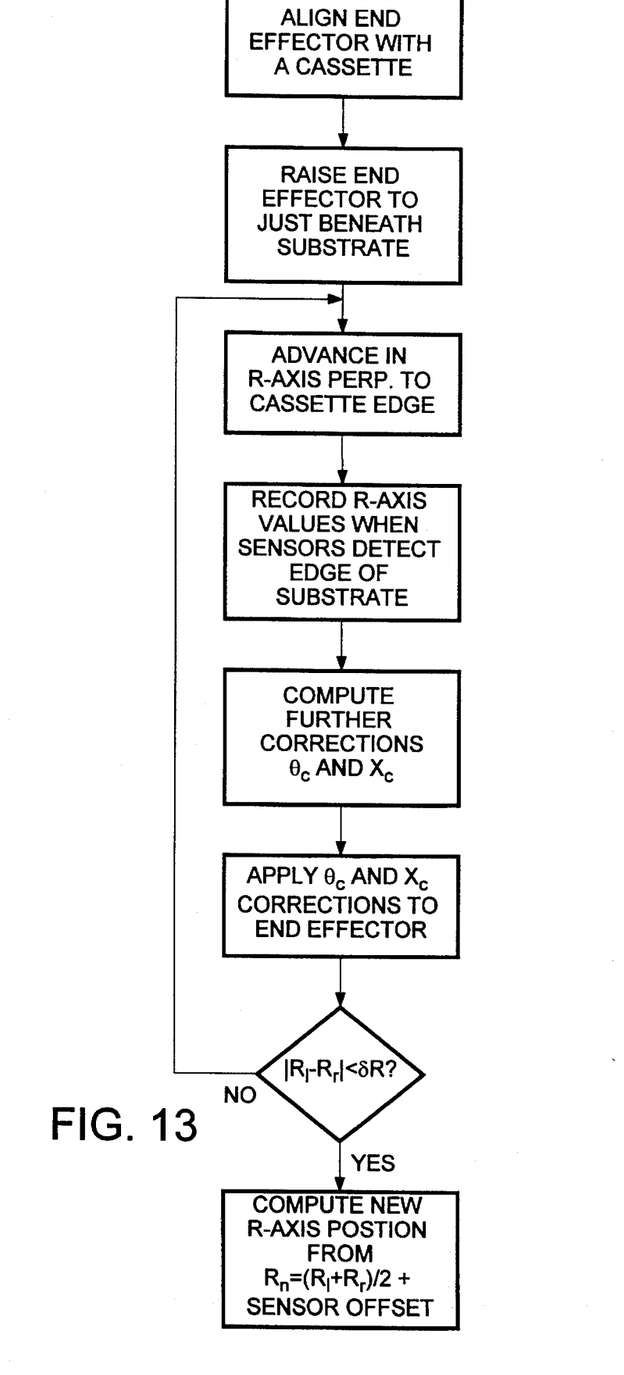
FIG. 13 is a flowchart depicting the operations performed by the invention in correcting for substrate position and orientation in a cassette.

Substrate Position/Orientation (FIG. 13):

Alignment with a substrate is performed by basically the same sequence of steps that are used to align with a cassette. After aligning the end effector 32 with a cassette 18, the robot mechanism raises the end effector to a level just beneath a selected substrate 30, and advances the end effector radially, in a direction perpendicular to the front edge of the cassette. The end effector 32 is then positioned under the substrate 30, substantially as shown in FIG. 4, but if the substrate 30 is not aligned with the cassette 18 a further correction is needed. The end effector 32 is advanced until both detectors 34 and 36 have sensed the edge of the substrate 30, and the radial positions at which each of the detectors sense the substrate edge are recorded, as $R_l$ and $R_r$, respectively. Further corrections $\theta_c$ and $X_c$ are computed in accordance with equations (1) and (2), above. Computation of these corrections may be omitted if the two radial measurements are close enough, i.e. if $|R_l-R_r|<\delta R$, where $\delta R$ is a selected tolerance value.

The robot mechanism makes the calculated corrections and then approaches the substrate 30 again and records new values for $R_l$ and $R_r$. If the difference between the two measurements is still greater than $\delta R$, the correction calculations are repeated. After a selected number of attempts to reduce the difference in the two measurements below the tolerance $\delta R$, picking up the substrate 30 may be aborted.

Once the corrections to X and $\theta$, if any, are made, the robot mechanism computes a new R position for picking up the substrate 30, from the expression:

$$R_n=(R_l+R_r)/2+\text{sensor offset.}$$

Figure 5:
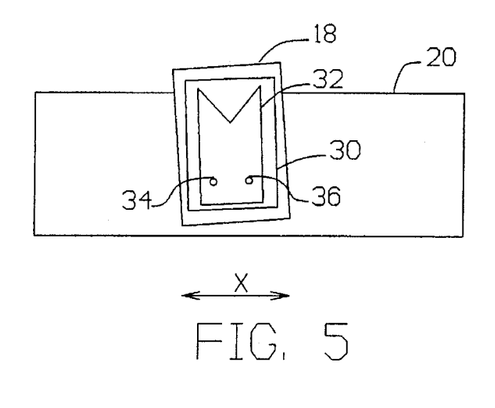
Figure 6:
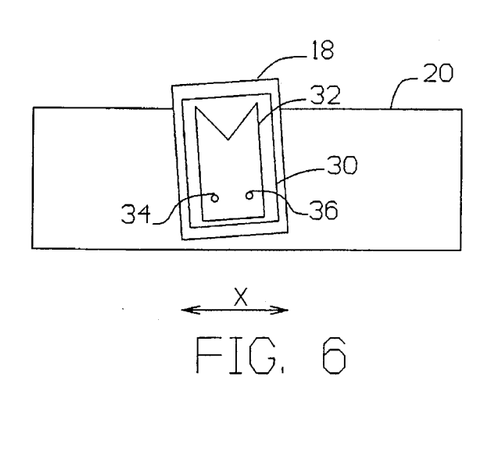
Figure 7:
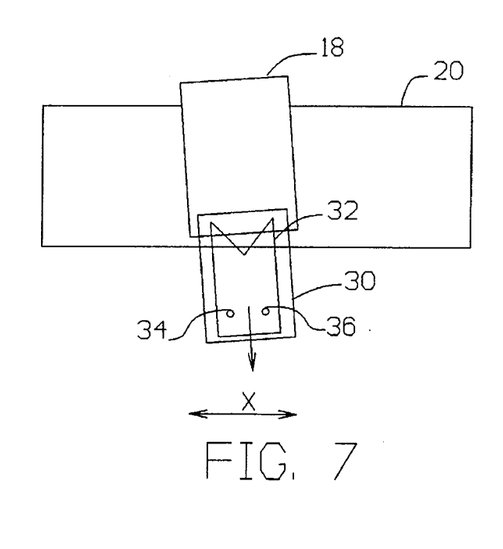
Figures 14, 15:
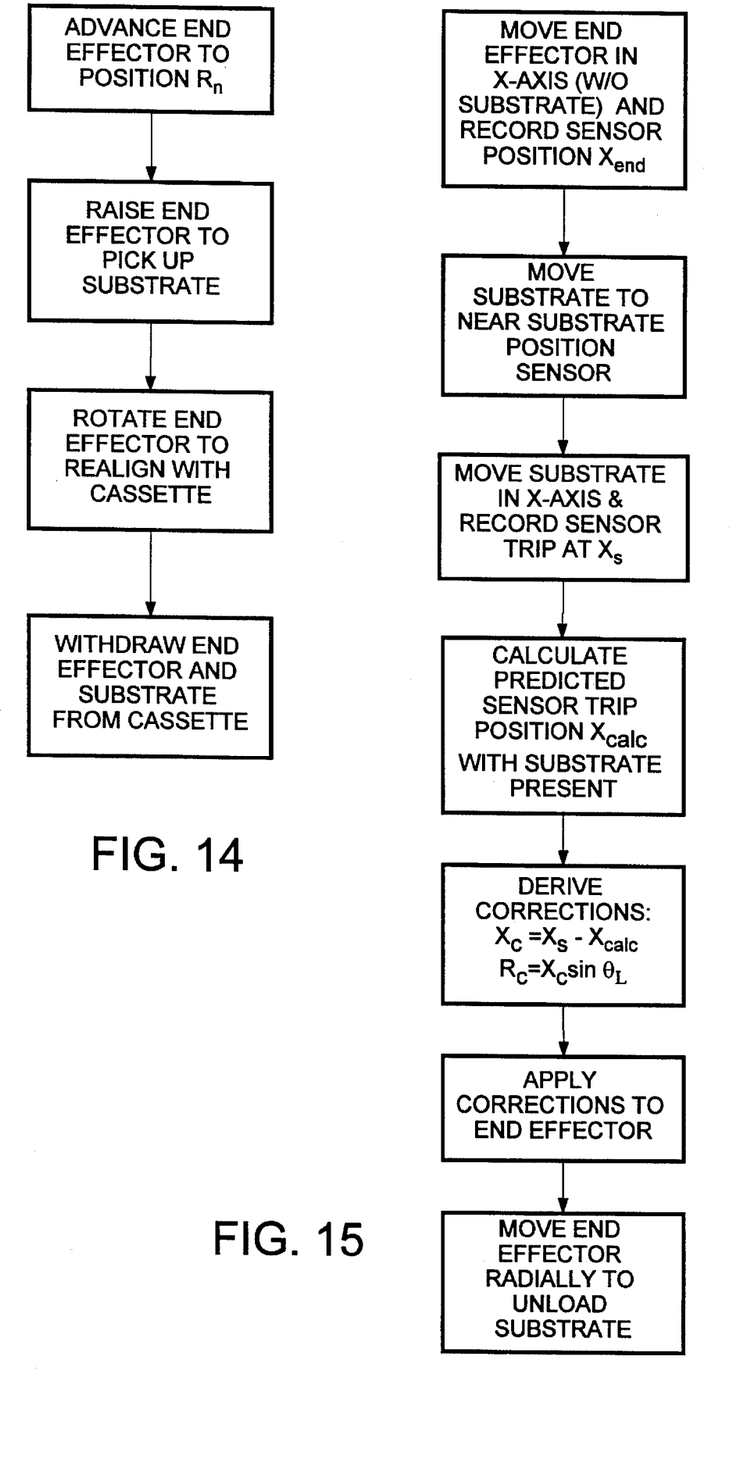
FIG. 14 is a flowchart depicting the operations performed by the invention in removing a substrate from a cassette.
FIG. 15 is a flowchart depicting the operations performed by the invention in correcting for substrate position an alignment with respect to an end effector prior to unloading a substrate.

As illustrated in FIG. 14, the end effector 32 is advanced under the substrate 30 to this new position, which is shown in FIG. 5, and raised to pick up the substrate in near perfect alignment with the end effector. Then the position of the end effector 32 is adjusted to align the edges of the substrate 30 with the sides of the cassette 18. Basically this step reverses the angular correction made for the substrate position, but carries the substrate to a position in alignment with the cassette, as shown in FIG. 6. At this point the substrate 30 is withdrawn from the cassette 18 in a radial direction, as indicated in FIG. 7, without any scraping or other contact with the cassette walls.

Figure 8:
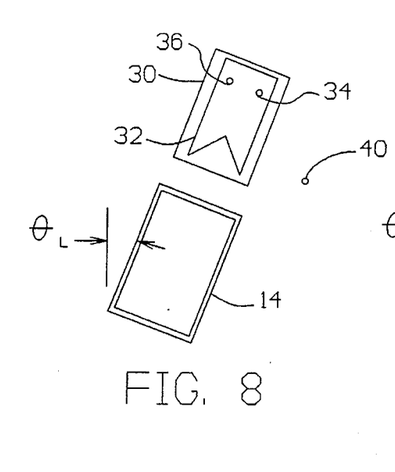
FIG. 8 is a plan view diagram showing a substrate positioned in front of a loadlock.
Figure 9:
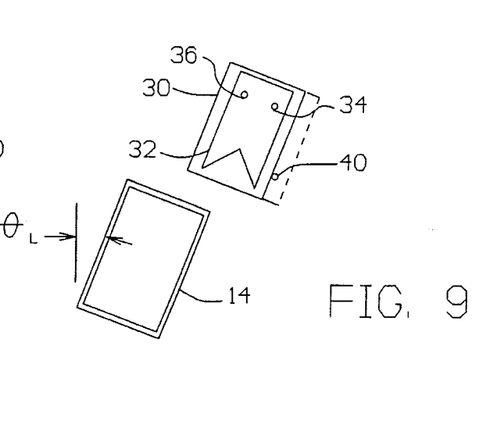
FIG. 9 is a diagram similar to FIG. 8, but showing use of a substrate sensor used to compensate for substrate positional errors.
Figure 10:
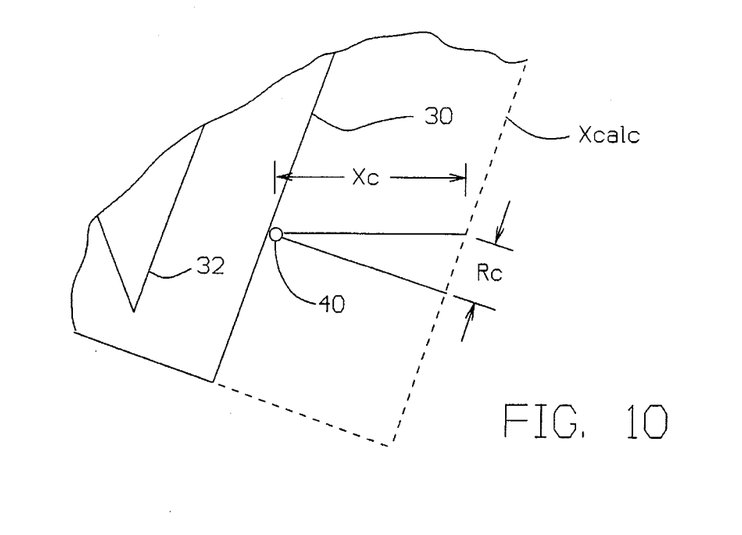
FIG. 10 is an enlarged fragmentary view similar to FIG. 9, showing how corrections are computed.

Placing Substrate in Loadlock (FIG. 15):

Placing the substrate in a loadlock poses additional positioning and orientation problems. Although the substrate 30 is aligned with the end effector 32, it may not be perfectly centered over the end effector in a lateral sense. Therefore, the precise position of the substrate must first be determined using a substrate position sensor 40, located to one side of the loadlock 14, as indicated in FIG. 8. The robot mechanism 16 moves the substrate 30 to the predicted position and orientation of the loadlock 14, and then translates the substrate in the X-axis direction until the substrate position sensor 40 is tripped by the edge of the substrate 30, as shown in FIG. 9. This X-axis position is recorded as $X_s$.

Prior to performing substrate loading operations, the end effector 32 is translated in the X-axis direction, and the X-axis position at which the end effector trips the substrate position sensor is recorded, as $X_{end}$. The calculated X-axis position $X_{calc}$ at which the substrate should be sensed is given by:

$$X_{calc}=X_{end}-[(\text{substrate width})-(\text{end effector width})]/2\cos\theta_L$$

where $\theta_L$ is the loadlock angle with respect to the X axis. The calculated position of the substrate 30 is indicated by a broken line in FIG. 9. An X-axis correction is calculated as $X_c=X_s-X_{calc}$. Then an R-axis correction is calculated as $R_c=X_c \sin\theta_L$. Once these corrections are made to X and R, the substrate 30 is positioned precisely at the desired starting position with respect to the loadlock 14, and can be unloaded by moving it radially forward to the corrected unloading position.

Figure 16:
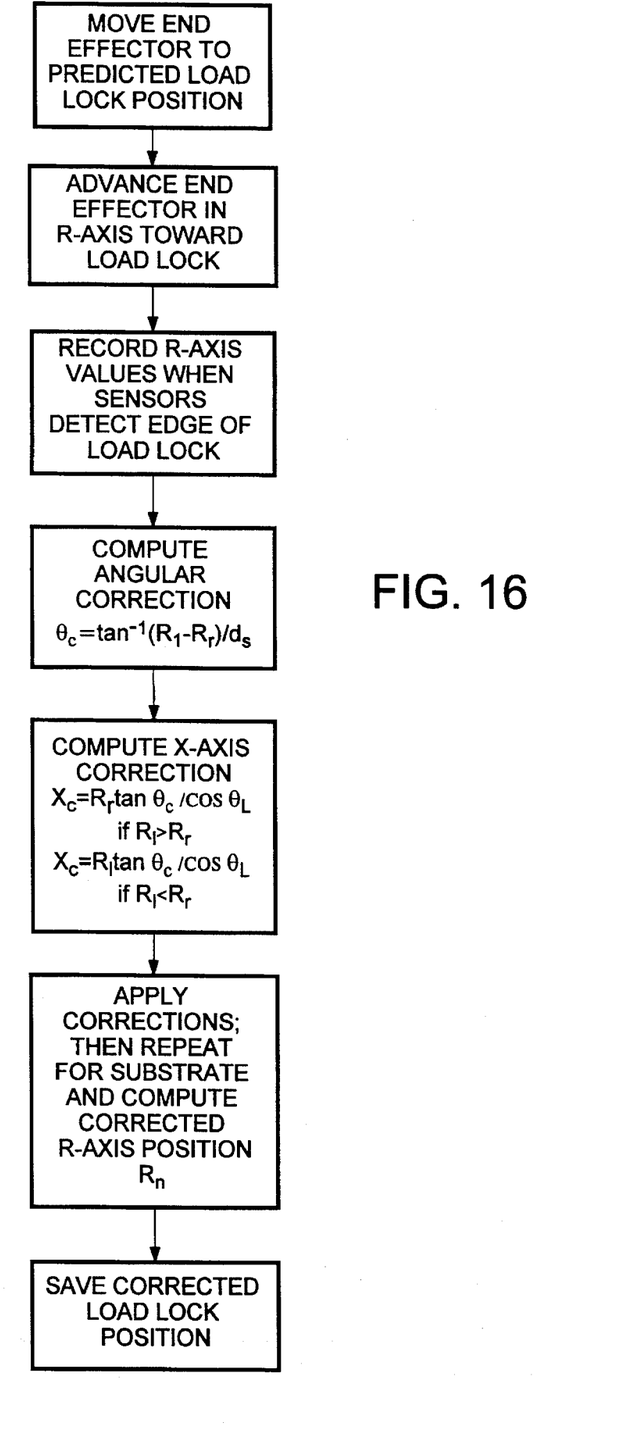
FIG. 16 is a flowchart depicting the operations performed by the invention in correcting for the position and orientation of a loadlock.

Loadlock Position/Orientation (FIG. 16):

When a system is first installed, the location of each loadlock needs to be determined. For this purpose, the robot mechanism moves the end effector 32 to a predicted load lock position. A substrate is already in the load lock, having been placed there from the other (vacuum) side of the lock. The end effector 32 is extended into the loadlock and the R position of each detector 34 and 36 is recorded. The angular correction and X-axis correction is then calculated, using expressions similar to (1) and (2). Specifically:

$$\theta_c=\tan^{-1}((R_l-R_r)/d_s).$$

$$X_c=-[R_l \tan\theta_c/\cos\theta_L] \text{ if } R_l>R_r, \text{ or } -[R_r \tan\theta_c/\cos\theta_L] \text{ otherwise.}$$

Correction is made in the $\theta$ axis and the X axis. Then the end effector 32 is retracted along the R axis until it clears the substrate 30. The process is repeated, moving the end effector 32 radially into the loadlock 14, measuring $R_l$ and $R_r$, and making correction in the $\theta$ axis and the X axis. A new R position $R_n$ is then calculated, in order to pick up the substrate centered, where $R_n=(R_l+R_r)/2+\text{sensor offset}$. The corrected $\theta$, X and R position coordinates of the loadlock are used to update these values stored for the robot mechanism, and the corrected values will be employed each time the robot is subsequently used to load a substrate in, or unload a substrate from, the loadlock 14.

After picking a substrate 30 up from the loadlock 14, the exact position of the substrate is detected using the substrate position sensor 40, in much the same way as was described in relation to placing a substrate in the loadlock. Specifically, the robot mechanism 16 translates the substrate 30 in the X-axis direction until the substrate position sensor 40 is tripped, saving the X-axis value ($X_s$) at this point. An X-axis correction is calculated from $X_c=-X_s-X_{calc}$, where $X_{calc}$ is the previously referred to calculated position of the substrate (obtained from $X_{end}$, the position of the end effector when tripping the substrate position sensor, and the widths of the end effector and substrate). The position of the end effector is corrected by $X_c$ and $R_c$, where $R_c=X_c \sin\theta_L$.

Modified Substrate Pickup Procedure:

In the substrate pickup procedure described above, corrections were made in the X and $\theta$ values based on sensed values of $R_l$ and $R_r$; and then the end effector was moved into a centered pickup position based on the average of $R_l$ and $R_r$, plus a sensor offset distance. A more efficient procedure is to calculate correction values for $\theta$ and X, and at the same time calculate a new value for R, such that the end effector will be centered under the substrate for the pickup operation.

Figure 11:
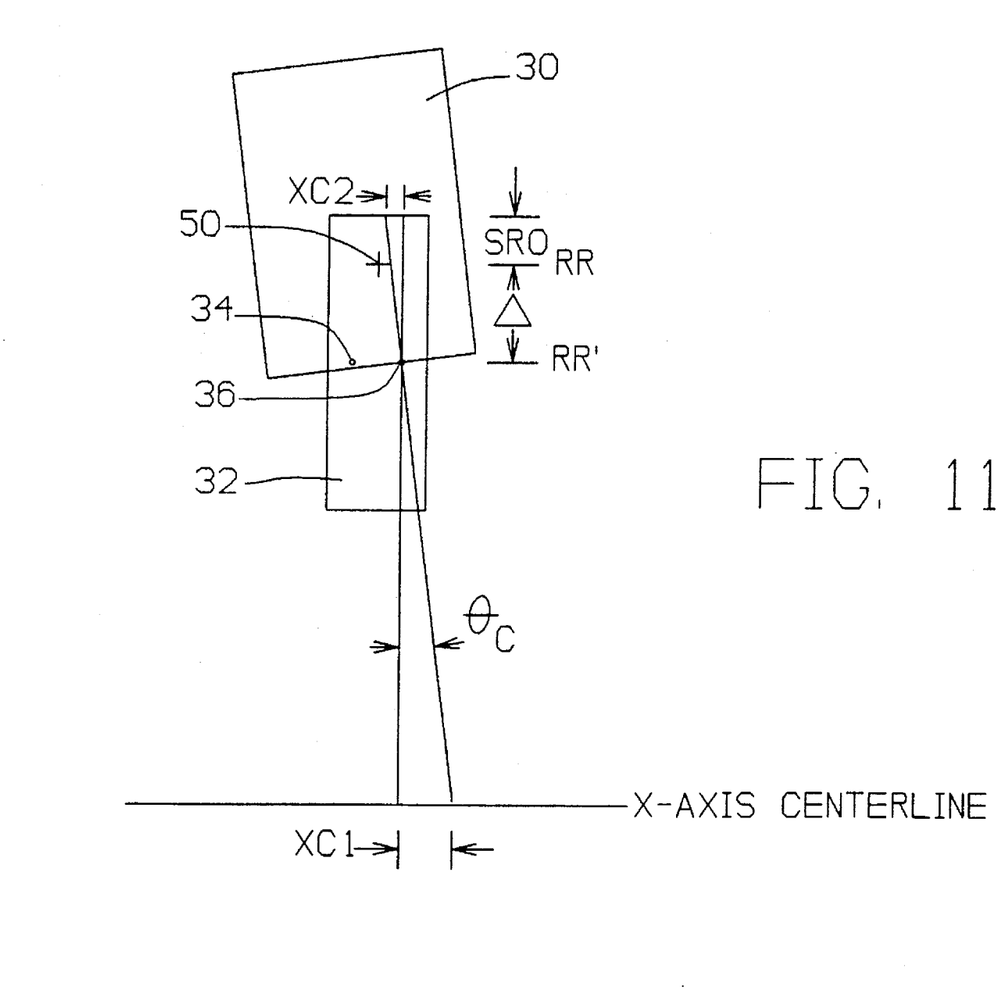
FIG. 11 is a diagram depicting a more efficient technique for picking up a substrate from a cassette or a loadlock.

The basis for this procedure is illustrated in FIG. 11, which shows the outline of a substrate 30 and an end effector 32, with sensors 34 and 36. The substrate 30 is angularly offset from the end effector 32 by an angle $\theta_c$ and the right sensor 36 is shown immediately over the edge of the substrate, at which point the radial motion of the end effector is stopped while corrections are calculated for $\theta$, X and R. $R_r$ is the radius position of a reference point 50 on the end effector in the position illustrated (just as the right sensor 36 is tripped). $R_r'$ is a shorter radius position, measured to the right sensor 36. As previously explained, the angle correction is given by:

$$\theta_c=\tan^{-1}(R_l-R_r)/d_s.$$

The X-axis correction $X_c$ can be considered as made up of two components: $X_c=X_{c1}+X_{c2}$, where:

$X_{c1}=R_r' \sin \theta_c$ (for $R_r > R_l$), and $X_{c2}=(SL/2) \sin \theta_c$, where SL=substrate length.

The difference between $R_r$ and $R_r'$ is defined as $\Delta$. Therefore, $R_r = R_r' - \Delta$.

The distance $\Delta$ is also (SL/2)–SRO, where SRO is the offset distance between the sensor trip point and the final position of the substrate. Therefore, $R_r' = R_r - (SL/2) + SRO$.

The overall X-axis correction may be expressed as:

$X_c = (R_r' + SL/2) \sin \theta_c$, or $X_c = (R_r + SRO) \sin \theta_c$.

This is the required X-axis correction. The required new R value may be expressed as $R_n = R_1 + R_2$, where $R_1 = R_r'/\cos \theta_c$, and $R_2 = SL/2$.

For picking up substrates from a loadlock, the equations for X-axis correction and the new value of R must also take into account the angular orientation of the loadlock $\theta_L$. The expressions for $X_c$ and $R_n$ are:

$X_c = (R_r + SRO) \sin \theta_c / \cos \theta_L * (-1)$ $R_n = (R_r - SL/2 + SRO)/\cos \theta_c + SL/2 + |X_c \tan \theta_L|$.

The latter two expressions are generic to the loadlock and cassette substrate pickup operations, wherein the angle $\theta_L$ is 180° for the case of substrate pickup from a cassette.

Conclusion:

It will be appreciated from the foregoing that the present invention represents a significant advance in the field of automatic handling of rectangular substrates or other workpieces. In particular, the invention provides for automatic alignment and centering of the end effector of a robot mechanism with substrates, substrate cassettes, and loadlocks. Angular offsets in substrate, cassette and loadlock positions are automatically compensated, to avoid scraping and other contact between substrates and the cassettes or loadlocks in which the substrates are placed, or from which they are removed. It will also be appreciated that, although a specific embodiment of the invention has been described for purposes of illustration, various modifications may be made without departing from the spirit and scope of the invention. Accordingly, the invention should not be limited except as by the appended claims.

I claim:

1. A method for aligning a robot arm with a workpiece having a straight edge, the method comprising:

positioning the robot arm adjacent to a predicted workpiece location;

moving the robot arm toward the workpiece in a direction predicted to be perpendicular to a straight front edge of the workpiece;

sensing the location of the straight front edge with at least two sensors installed on the robot arm, wherein each of the at least two sensors will provide a different location solution if the straight front edge is not perpendicular to the direction of robot arm movement toward the workpiece;

calculating, from the location solutions provided by the at least two sensors, an angular correction needed to be applied to the robot arm such that it will approach the front edge of the workpiece perpendicularly; and calculating from the angular correction a corresponding linear correction needed to be applied to the robot arm, because of the angular correction, to ensure that the robot arm will approach the workpiece at a desired relative location.

2. A method as defined in claim 1, and further comprising the steps of:

applying the angular and linear corrections to the robot arm; and moving the robot arm toward the workpiece in the corrected angular direction, to position a workpiece support of the robot arm directly beneath the workpiece.

3. A method as defined in claim 2, and further comprising the steps of:

computing a corrected distance through which to move the robot arm; and moving the robot arm through the corrected distance, such that the workpiece support is centered under the workpiece.

4. A method for picking up a workpiece having a generally rectangular shape from a workpiece container, wherein the precise orientation of the container, and of the workpiece within the container, are unknown, the method comprising the steps of:

positioning a workpiece support of a robot arm in a location adjacent to a predicted workpiece container location;

detecting a front edge of the container with at least two sensors mounted on the workpiece support;

applying angular and linear corrections to the workpiece support to align it with the detected position of the container;

moving the workpiece support into the container and beneath a workpiece to be picked up;

detecting a front edge of the workpiece within the container;

applying angular and linear corrections to the workpiece support to align it with the detected position of the workpiece;

picking up the workpiece;

applying angular and linear corrections to the workpiece support to move the workpiece into alignment with the container; and withdrawing the workpiece from the container.

5. A method as defined in claim 4, wherein:

the workpiece support is mounted at the end of the robot arm, for radial and angular movement about an axis;

each step of detecting a front edge includes recording a first radial distance from the axis to a reference point on the workpiece support, when a first sensor on the workpiece support detects the straight edge, and recording a second radial distance from the axis to the reference point when a second sensor on the workpiece support detects the straight edge; and each step of applying angular and linear corrections is preceded by a step of computing the angular and linear corrections from the first and second radial distances and the spacing between the first and second sensors.

6. A method as defined in claim 5, wherein the step of computing the angular and linear corrections includes:

computing the angular correction from the inverse tangent of the ratio of the difference between the first and second radial distances and the spacing between the first and second sensors; and computing the linear correction from the product of the product of one of the radial distances and the tangent of the angular correction.

7. A method as defined in claim 4, and further comprising the steps of:

sensing the lateral position of the substrate on the substrate support; and compensating for any deviation from a predicted lateral position of the substrate on the substrate support.

8. A method as defined in claim 7, wherein:

the step of sensing the lateral position of the substrate includes translating the substrate linearly and detecting the position of a side edge of the substrate as it passes a substrate detector.

9. A method as defined in claim 8, wherein:

the method further comprises the preliminary steps of translating the substrate support linearly and detecting the position of a side edge of the substrate support, and then deriving a predicted lateral position of the substrate edge, based on an assumption of symmetrical positioning of the substrate on the substrate support; and the step of compensating for any deviation from the predicted lateral position of the substrate includes computing a linear correction from the difference between the predicted and detected positions of the substrate edge, and computing a radial correction from the linear correction and a known orientation of a container in which the substrate is to be placed.

10. A method for moving generally rectangular workpiece from a first container to a second container, using a substrate support capable of angular and radial motion about an axis, which is movable linearly, wherein the precise orientation of the containers, and of the workpiece within the first container, are unknown, the method comprising the steps of:

determining the orientation of the first container, by moving a workpiece support to a predicted linear position adjacent to the container, orienting the workpiece support at a predicted angular position, and advancing the workpiece support radially to detect an edge of the container;

correcting the predicted linear and angular positions of the first container;

performing the foregoing steps for the second container;

moving the workpiece support to the corrected position of the first container and advancing the support radially toward a workpiece in the container;

detecting any orientation error of the workpiece in the first container and adjusting the linear and angular positions of the workpiece support to compensate for the orientation error;

picking up the workpiece with the workpiece support;

re-adjusting, if necessary, the angular and linear positions of the workpiece support to conform with the orientation of the first container;

withdrawing the workpiece and workpiece support from the first container without contact with the container;

moving the workpiece support to the corrected linear and angular position of the second container;

advancing the workpiece support radially into the second container; and placing the workpiece in the second container.

11. A method as defined in claim 10, and further comprising:

after withdrawing the workpiece from the first container, translating the workpiece support laterally past a workpiece edge sensor, to determine the lateral position of the workpiece with respect to the workpiece support; and compensating for any difference between the sensed position of the workpiece edge and a predicted position of the workpiece edge, to ensure that the workpiece is placed centrally in the second container.

12. A method as defined in claim 11, wherein:

the workpiece is a rectangular substrate;

the first container is a substrate cassette; and the second container is a loadlock for access to a vacuum chamber.

13. A method as defined in claim 11, wherein:

the workpiece is a rectangular substrate;

the first container is a loadlock for access to a vacuum chamber; and the second container is a substrate cassette.

14. Apparatus for aligning a robot arm with a workpiece having a straight edge, the apparatus comprising:

means for positioning the robot arm linearly adjacent to a predicted workpiece location;

means for moving the robot arm toward the workpiece in a direction predicted to be perpendicular to a straight front edge of the workpiece;

at least two sensors installed on the robot arm, for sensing the location of the front edge of the workpiece as the robot arm is moved toward the workpiece, wherein each of the at least two sensors will provide a different location solution if the straight front edge is not perpendicular to the direction of robot arm movement toward the workpiece;

means for calculating, from the location solutions provided by the at least two sensors, an angular correction needed to be applied to the robot arm such that it will approach the front edge of the workpiece perpendicularly; and means for calculating from the angular correction a corresponding linear correction needed to be applied to the robot arm, because of the angular correction, to ensure that the robot arm will approach the workpiece at a desired relative location.

15. Apparatus as defined in claim 14, and further comprising:

means for applying the angular and linear corrections to the robot arm; and means for moving the robot arm toward the workpiece in the corrected angular direction, to position a workpiece support of the robot arm directly beneath the workpiece.

16. Apparatus as defined in claim 15, and further comprising:

means for computing a corrected distance through which to move the robot arm; and means for moving the robot arm through the corrected distance, such that the workpiece support is centered under the workpiece.

17. Apparatus for picking up a workpiece having a generally rectangular shape from a workpiece container, wherein the precise orientation of the container, and of the workpiece within the container, are unknown, the apparatus comprising:

means for positioning a workpiece support of a robot arm in a location adjacent to a predicted workpiece container location;

edge detection means, including at least two sensors mounted on the workpiece support, for detecting a front edge of the container;

means for applying angular and linear corrections to the workpiece support to align it with the detected position of the container;

means for moving the workpiece support into the container and beneath a workpiece to be picked up, wherein the sensors detect a front edge of the workpiece within the container;

means for applying angular and linear corrections to the workpiece support to align it with the detected position of the workpiece and permit picking up the workpiece in alignment with the workpiece support; and means for applying angular and linear corrections to the workpiece support to move the workpiece into alignment with the container, whereby the workpiece may be withdrawn from the container without unwanted contact.

18. Apparatus as defined in claim 17, wherein:

the workpiece support is mounted at the end of the robot arm, for radial and angular movement about an axis;

the edge detection means include means for recording a first radial distance from the axis to a reference point on the workpiece support, when a first sensor on the workpiece support detects the straight edge, and means for recording a second radial distance from the axis to the reference point when a second sensor on the workpiece support detects the straight edge; and the apparatus further comprises means for computing the angular and linear corrections from the first and second radial distances and the spacing between the first and second sensors.

19. Apparatus as defined in claim 18, wherein the means for computing the angular and linear corrections includes:

means for computing the angular correction from the inverse tangent of the ratio of the difference between the first and second radial distances and the spacing between the first and second sensors; and means for computing the linear correction from the product of one of the radial distances and the tangent of the angular correction.

20. Apparatus as defined in claim 17, and further comprising:

means for sensing the lateral position of the substrate on the substrate support; and means for compensating for any deviation from a predicted lateral position of the substrate on the substrate support.

21. Apparatus as defined in claim 20, wherein:

the means for sensing the lateral position of the substrate includes an additional sensor, for detecting the position of a side edge of the substrate as it is translated linearly.

22. Apparatus as defined in claim 21, wherein:

the apparatus further comprises means for translating the substrate support linearly and detecting the position of a side edge of the substrate support, and means for deriving a predicted lateral position of the substrate edge, based on an assumption of symmetrical positioning of the substrate on the substrate support; and the means for compensating for any deviation from the predicted lateral position of the substrate includes means for computing a linear correction from the difference between the predicted and detected positions of the substrate edge, and means for computing a radial correction from the linear correction and a known orientation of a container in which the substrate is to be placed.

* * * * *